United States Patent
Jonishi et al.

(10) Patent No.: US 8,928,368 B2
(45) Date of Patent: Jan. 6, 2015

(54) GATE DRIVING CIRCUIT

(71) Applicant: Fuji Electric Co., Ltd., Kawasaki-shi (JP)

(72) Inventors: Akihiro Jonishi, Matsumoto (JP); Hitoshi Sumida, Matsumoto (JP)

(73) Assignee: Fuji Electric Co., Ltd., Kawasaki-Shi (JP)

( * ) Notice: Subject to any disclaimer, the term of this patent is extended or adjusted under 35 U.S.C. 154(b) by 0 days.

(21) Appl. No.: 14/170,089

(22) Filed: Jan. 31, 2014

(65) Prior Publication Data

US 2014/0145763 A1    May 29, 2014

Related U.S. Application Data

(62) Division of application No. 13/298,279, filed on Nov. 16, 2011, now Pat. No. 8,742,802.

(30) Foreign Application Priority Data

Nov. 17, 2010 (JP) ................. 2010-256757

(51) Int. Cl.
*H03K 17/06* (2006.01)
*H03K 17/081* (2006.01)
*H03K 17/16* (2006.01)
*H03K 17/0814* (2006.01)

(52) U.S. Cl.
CPC ........ *H03K 17/08104* (2013.01); *H03K 17/163* (2013.01); *H03K 17/08142* (2013.01)
USPC .......................................... 327/112; 327/434

(58) Field of Classification Search
USPC ................... 327/108, 109, 110, 112
See application file for complete search history.

(56) References Cited

U.S. PATENT DOCUMENTS 7,514,967 B2    4/2009 Higashi et al.
8,742,802 B2 *  6/2014 Jonishi et al. ................. 327/112

FOREIGN PATENT DOCUMENTS

| JP | 04-083419 A | 3/1992 |
| JP | 07-099429 | 4/1995 |
| JP | 2003-133938 A | 5/2003 |

OTHER PUBLICATIONS

Office Action issued by Japan Patent Office on Oct. 29, 2013 with English translation.
IEEE Journal of Solid-State Circuit, vol. SC-21, Feb. 1986, pp. 187-192.

* cited by examiner

*Primary Examiner* — Hai L Nguyen
(74) *Attorney, Agent, or Firm* — Rabin & Berdo, P.C.

(57) ABSTRACT

A gate driving circuit for driving an insulated gate switching element, including a gate charging circuit configured to charge gate capacitance of the insulated gate switching element, and a gate discharging circuit that is connected in series with the gate charging circuit and configured to discharge a charge of the gate capacitance. The gate charging circuit includes a first p-channel metal oxide semiconductor field effect transistor (MOSFET), and a first hybrid normally-on enhancement MOSFET insertion (NOEMI) circuit connected in series with a drain of the first p-channel MOSFET. The gate discharging circuit includes a first n-channel MOSFET, and a second hybrid NOEMI circuit connected in series with a drain of the first n-channel MOSFET.

5 Claims, 12 Drawing Sheets

GATE DRIVING CIRCUIT

This application is a divisional application of co-pending U.S. patent application Ser. No. 13/298,279, filed Nov. 16, 2011, which is based on and claims the benefit of priority under 35 U.S.C. §119 from Japanese Patent Application No. 2010-256757, filed on Nov. 17, 2010, the contents of which are incorporated herein by reference.

BACKGROUND OF THE INVENTION

1. Field of the Invention

This invention relates to a gate driving circuit for driving an insulated gate switching element.

2. Description of the Related Art

Recently, insulated gate switching elements (sometimes known as power metal oxide semiconductors, or, hereinafter, power MOSs) such as insulated gate bipolar transistors (IGBTs) and power MOS field effect transistors (power MOSFETs) have been widely used in power conversion devices, and accordingly the application of the power MOSs to hybrid vehicles, electric vehicles, and so on has recently attracted attention.

FIG. 8 is a circuit diagram of a gate driving circuit for driving a power MOS according to the related art. This gate driving circuit 50 includes an inverter circuit 51 having a p-channel MOSFET QP1 and an n-channel MOSFET QN1 connected in series (having the drains respectively connected to each other). A high potential side power supply terminal Vcc of the gate driving circuit 50 is connected to a source of a p-channel MOSFET QP1, and a low potential side power supply terminal GND is connected to a source of an n-channel MOSFET QN1.

An input terminal Vin of the inverter circuit 51 is connected to a gate of each of the p-channel MOSFET QP1 and the n-channel MOSFET QN1. A connection point of the p-channel MOSFET QP1 and the n-channel MOSFET QN1 is connected to one end of a gate resistor R1, and the other end of the gate resistor R1 is connected to an output terminal Vout. An anode of a diode D1 is connected to the low potential side terminal GND, and a cathode of the diode D1 is connected to the output terminal Vout. The diode D1 is a protection diode for preventing an excessive voltage from being applied to the output terminal Vout. Further, a voltage Vd1 is a voltage between the connection point of the p-channel MOSFET QP1 and the n-channel MOSFET QN1 and the low potential side terminal GND, and is the same as a drain-source voltage Vds1 of the n-channel MOSFET QN1.

FIG. 9 is diagram of a main circuit using a power MOSFET as a power MOS. Here, a main circuit 60 used for an electric vehicle or the like will be described. A power supply of the main circuit 60 is different from the power supply of the gate driving circuit 50, and a voltage of a high potential side power supply terminal Vcco of the main circuit 60 is higher than that of the high potential side power supply terminal Vcc of the gate driving circuit 50. In the case of an electric vehicle, a load is an electric motor, and an equivalent circuit of the electric motor becomes a circuit including a resistor R2 and an inductor L1 connected in series. Also, the power MOSFET is an re-channel type, and herein is denoted by QN4. In the power MOSFET QN4, a gate-drain capacitance is denoted by Cgd, a gate-source capacitance is denoted by Cgs, and a drain-source capacitance is denoted by Cds. A voltage between a connection point of the inductor L1 and the power MOSFET QN4 and the low potential side terminal GND is denoted by Vd3, and is the same as a drain-source voltage Vds4 of the power MOSFET QN4.

Next, a configuration of the main circuit 60 will be described. The high potential side power supply terminal Vcco of the main circuit 60 is connected to the resistor R2, a drain of the power MOSFET QN4 is connected to the inductor L1, and a source of the power MOSFET QN4 is connected to the low potential side power supply terminal GND. A gate of the power MOSFET QN4 is connected to a gate terminal Vg. The gate-drain capacitance Cgd is provided between the gate and drain of the power MOSFET QN4, the gate-source capacitance Cgs is provided between the gate and source of the power MOSFET QN4, and the drain-source capacitance Cds is provided between the drain and source of the power MOSFET QN4. A gate capacitance Cg of the power MOSFET QN4 is the same as the sum of the gate-source capacitance Cgs and the gate-drain capacitance Cgd.

FIG. 10 is a diagram of a circuit used for a simulation of a case where the output terminal Vout of FIG. 8 is connected to the gate terminal Vg of the FIG. 9. If the n-channel MOSFET QN1 constituting the inverter circuit 51 of the gate driving circuit 50 is turned on, and the p-channel MOSFET QP1 is turned off, the power MOSFET QN4 of the main circuit 60 is turned off.

FIG. 11 is a diagram illustrating the individual waveforms of the voltage Vd1 which is the same as the drain-source voltage Vds1 of the n-channel MOSFET QN1, a current Id1 flowing in the n-channel MOSFET QN1, a voltage of the input terminal Vin, and a voltage Vd3 which is the same as the drain-source voltage Vds4 of the power MOSFET QN4, when the n-channel MOSFET QN1 is in the ON state in FIG. 10. The voltage Vd1 and the voltage Vd3 are voltages relative to the potential of the low potential side terminal GND.

FIG. 12 is a diagram illustrating the waveforms of the voltage Vd1 and a drain current Id1 flowing in the re-channel MOSFET QN1, when the n-channel MOSFET QN1 is in the ON state in FIG. 10.

If a high-potential signal is input to the input terminal Vin of FIG. 10, the n-channel MOSFET QN1 constituting the gate driving circuit 50 changes to the ON state, and the potential of the output terminal Vout becomes a low level. Therefore, the power MOSFET QN4 having the gate connected to the output terminal Vout is turned off.

The voltage Vd1, which is the same as the drain-source voltage Vds1 of the n-channel MOSFET QN1, gradually decreases from the voltage of the high potential side terminal Vcc. This is because the charge accumulated in the gate capacitance Cg (=Cgs+Csd) of the power MOSFET QN4 becomes a drain current Id1 of the n-channel MOSFET QN1 to be discharged to the low potential side terminal GND. As shown in a portion A, in a state in which the voltage Vd1 (which is the same as the drain-source voltage Vds1 of the n-channel MOSFET QN1) is high, a large amount of drain current Id1 flows. Therefore, hot-carriers are generated in the n-channel MOSFET QN1, which deteriorates the element characteristics of the n-channel MOSFET QN1. Examples of element characteristic deterioration include threshold voltage shift, a decrease in drain current, and so on.

As shown in FIG. 9, in a case where the load is a motor (shown by a reference symbol "L1" in FIG. 9), a surge voltage Vs is applied between the drain and source of the power MOSFET QN4 by an induced electromotive force of the motor so that the drain-source voltage Vds4 of the power MOSFET QN4 increases sharply.

The surge voltage Vs is represented as a product of the inductance L of the inductor L1 and a current reduction rate di/dt when the power MOSFET QN4 is turned off. In other words, an equation of Vs=L×di/dt is established. The voltage vd3 relative to the low potential side terminal GND (which is the same as the drain-source voltage Vds4 of the power MOSFET QN4) becomes a voltage obtained by superimposing the surge voltage Vs on the voltage of the high potential side terminal Vcco.

Since the gate and drain of the power MOSFET QN4 are linked to each other through the gate-drain capacitance Cgd of the power MOSFET QN4, the surge voltage Vs influences the gate of the power MOSFET QN4 so that the potential of the gate terminal Vg of the power MOSFET QN4 increases.

However, at the positions where the voltage Vd1 is increased by the influence of the drain-source voltage Vds4 (=Vd3) of the power MOSFET QN4, the voltage Vd1 is decreasing as shown by a reference symbol "B" in FIG. 12. In simulations, the degree of the increase is small.

Moreover, if the inductance L of the inductor L1 is large, the falling of the voltage Vd1 is plateaus before it falls as shown by a dotted line C, resulting in the drain-source voltage Vds1 (=Vd1) of the n-channel MOSFET QN1 to be maintained at a high level. Therefore, the inductance L of the inductor L1 increases, an amount of hot-carriers generated in the n-channel MOSFET QN1 also increases.

As described above, since the drain current Id1 flows in the n-channel MOSFET QN1 in the state in which the drain-source voltage Vds1 (=Vd1) of the n-channel MOSFET QN1 is high, the hot-carriers are generated in the re-channel MOSFET QN1, and causes element characteristic deterioration. The amount of hot-carriers becomes larger as the drain-source voltage Vds1 of the n-channel MOSFET QN1 increases, is proportional to the drain current Id1, and is proportional to the sixth power of the voltage Vd1.

Therefore, when the power MOSFET QN4 is turned off, a lot of hot-carriers are generated in the n-channel MOSFET QN1, so as to cause element deterioration.

Further, when the p-channel MOSFET QP1 of FIG. 8 is turned on so as to turn on the power MOSFET QN4, similarly, hot-carriers are generated in the p-channel MOSFET QP1, so as to cause element deterioration.

The hot-carriers are carriers (electrons and holes) that come to get energy due to a high electric field. When the hot-carriers enter a gate insulating film or the like of a MOS device, in the MOS device, the threshold voltage is shifted or the drain current decreases. That is, the hot-carriers cause element characteristic deterioration.

Next, a method of lowering the surge voltage Vs generated at the time of turning-off will be described.

For example, Japanese Patent Application Laid Open (JP-A) No. 7-99429 discloses a method of suppressing generation of a surge voltage Vs by actively increasing a gate voltage of a power MOS to allow a surge current to flow to the power MOS when the surge voltage Vs is generated.

Further, IEEE Journal of Solid-State Circuit, vol. SC-21, February 1986, pp. 187-192 discloses a circuit (NOEMI circuit) using a technology called normally-on enhancement MOSFET insertion (NOEMI). This circuit is a circuit including a MOSEFT, which is a normally-on enhancement MOSFET (NOEM) that is normally in an ON state, so as to suppress an amount of hot-carriers generated in a MOSFET connected in series with the NOEM.

The method of the JP-A No. 7-99429 is effective in protecting the power MOS. However, since the drain-source voltage Vds1 (=Vd1) of the n-channel MOSFET QN1 constituting the gate driving circuit 50 is high, hot-carrier generation in the n-channel MOSFET QN1 cannot be prevented by the method of JP-A No. 7-99429.

Also, IEEE Journal of Solid-State Circuit, vol. SC-21, February 1986, pp. 187-192 discloses that an NOEMI circuit is used in an integrated circuit such as an SRAM or a DRAM so as to suppress the generation of hot-carriers. However, it does not disclose that an NOEMI circuit is used in a gate driving circuit for driving a power MOS so as to suppress the amount of hot-carriers generated in a MOSFET constituting the gate driving circuit.

SUMMARY OF THE INVENTION

The invention was made to solve these problems, and an object of the invention is to provide a highly-reliable gate driving circuit that can be achieved by suppressing the amount of hot-carriers generated in a MOSFET.

In order to achieve the object, according to a first aspect of the invention, in a gate driving circuit which drives an insulated gate switching element, and includes a gate charging circuit for charging gate capacitance of the insulated gate switching element and a gate discharging circuit that is connected in series with the gate charging circuit and discharges the charge of the gate capacitance, the gate charging circuit includes a first p-channel MOSFET, and a second p-channel MOSFET having a source connected in series with a drain of the first p-channel MOSFET and constituting a first same-type NOEMI circuit, the gate discharging circuit includes a first n-channel MOSFET, and a second n-channel MOSFET having a source connected in series with a drain of the first n-channel MOSFET and constituting a second same-type NOEMI circuit, a drain of the second n-channel MOSFET is connected in series with a drain of the second p-channel MOSFET, a source of the first p-channel MOSFET is connected to a high potential side power supply terminal, a source of the first n-channel MOSFET is connected to the low potential side power supply terminal, a gate of the second p-channel MOSFET is connected to the low potential side power supply terminal, a gate of the second n-channel MOSFET is connected to the high potential side power supply terminal, the gate of the first p-channel MOSFET and a gate of the first n-channel MOSFET are connected to each other, a connection point of the gate of the first p-channel MOSFET and the gate of the first n-channel MOSFET is connected to an input terminal, and a connection point of the drain of the second p-channel MOSFET and the drain of the second n-channel MOSFET is connected to an output terminal.

According to a second aspect of the invention, in the first aspect, the first p-channel MOSFET, the second p-channel MOSFET, the first n-channel MOSFET, and the second n-channel MOSFET may have the same channel width.

According to a third aspect of the invention, in a gate driving circuit which drives an insulated gate switching element, and includes a gate charging circuit for charging gate capacitance of the insulated gate switching element and a gate discharging circuit that is connected in series with the gate charging circuit and discharges charge of the gate capacitance, the gate charging circuit includes a first p-channel MOSFET, and a first hybrid NOEMI circuit connected in series with a drain of the first p-channel MOSFET and constituting a portion of the gate charging circuit, the gate discharging circuit includes a first re-channel MOSFET, and a second hybrid NOEMI circuit connected in series with a drain of the first n-channel MOSFET and constituting a portion of the gate discharging circuit, the first hybrid NOEMI circuit includes a second p-channel MOSFET and a third n-channel MOSFET connected in parallel to each other, the second hybrid NOEMI circuit includes a second n-channel MOSFET and a third p-channel MOSFET connected in parallel to each other, each of a gate of the second p-channel MOSFET and a gate of the third p-channel MOSFET is connected to a low potential power supply side terminal, each of a gate of the second n-channel MOSFET and a gate of the third n-channel MOSFET is connected to a high potential power supply side terminal, a source of the second p-channel MOSFET is connected to the drain of the first p-channel MOSFET, a source of the third n-channel MOSFET is connected to the drain of the first n-channel MOSFET, a source of the first p-channel MOSFET is connected to the high potential power supply side terminal, a source of the first n-channel MOSFET is connected to the low potential power supply side terminal, a gate of the first p-channel MOSFET and a gate of the first n-channel MOSFET are connected to an input terminal to which an input signal is input, and a connection point of a drain of the second p-channel MOSFET and a drain of the third n-channel MOSFET is connected to an output terminal through a resistor, the output terminal being connected to a gate of the insulated gate switching element.

According to a fourth aspect of the invention, in the third aspect, a channel width of each of the second p-channel MOSFET and the third n-channel MOSFET constituting the first hybrid NOEMI circuit may be half the channel width of the first p-channel MOSFET, and a channel width of each of the second n-channel MOSFET and the third p-channel MOSFET constituting the second hybrid NOEMI circuit may be half the channel width of the first n-channel MOSFET.

According to a fifth aspect of the invention, in the first or third aspect, the gate charging circuit and the gate discharging circuit may constitute an inverter circuit.

According to a sixth aspect of the invention, in the first or third aspect, the insulated gate switching element may be an IGBT or a power MOSFET.

According to the invention, in a gate driving circuit having NOEMI circuits, same-type NOEMI circuits are connected in series with a p-channel MOSFET QP1 constituting a gate charging circuit and an n-channel MOSFET QN1 constituting a gate discharging circuit, respectively. Therefore, it is possible to suppress the amount of hot-carriers generated in the p-channel MOSFET QP1, the n-channel MOSFET QN1, and the NOEMI circuits.

Further, it is possible to further suppress the hot-carriers generated in the NOEMI circuits by replacing the same-type NOEMI circuits with the hybrid NOEMI circuits.

Since generation of hot-carriers is suppressed, it is possible to prevent element characteristic deterioration due to the hot-carriers and to manufacture a highly-reliable gate discharging circuit.

DETAILED DESCRIPTION OF THE PREFERRED EMBODIMENTS

Modes for carrying out the invention will be described with respect to the following embodiments. Further, the identical portions to those in a configuration according to the related art are denoted by the same reference symbols.

[First Embodiment]

Figure 1:
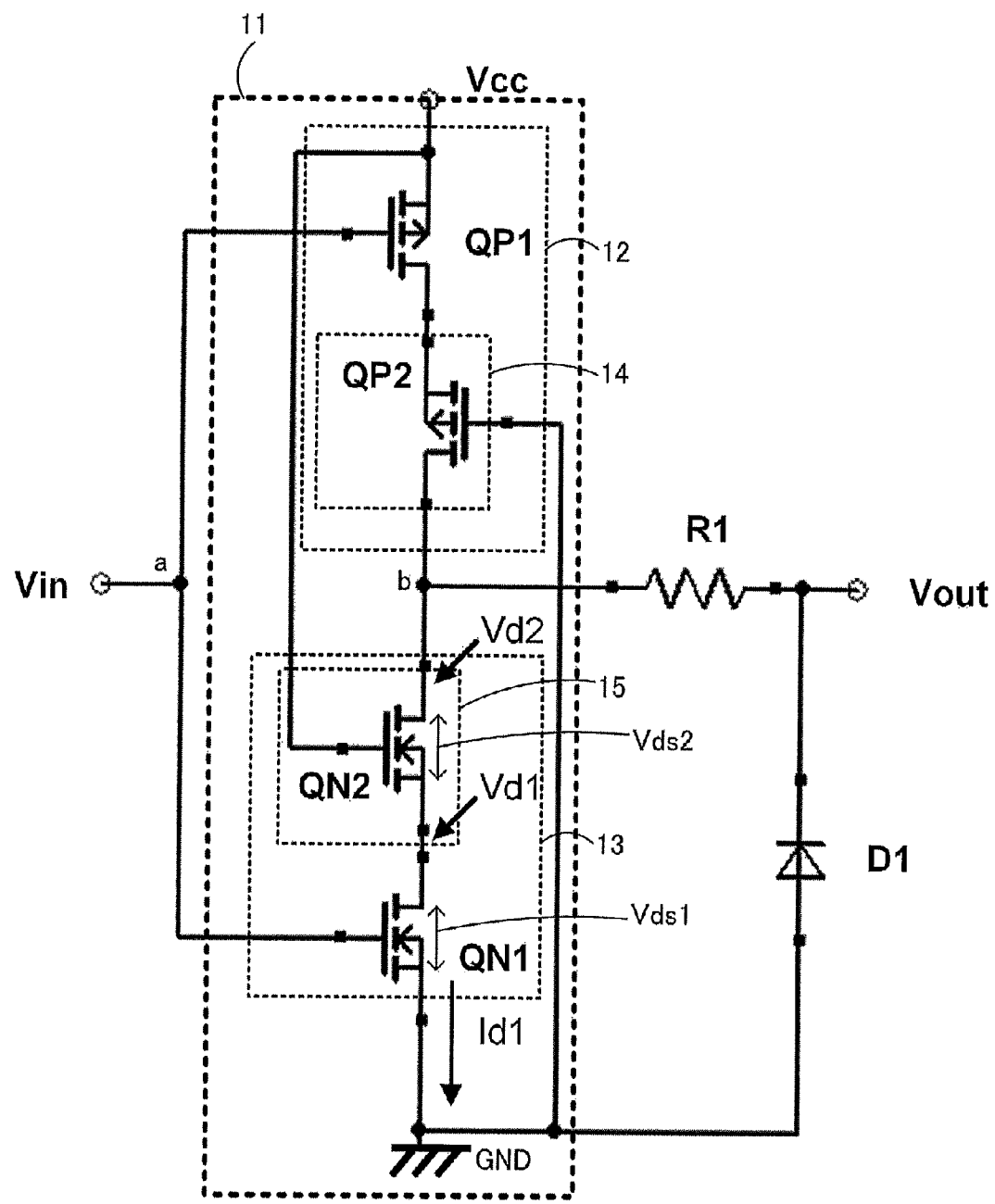
FIG. 1 is a circuit diagram illustrating main portions of a gate driving circuit according to a first embodiment of the invention.

FIG. 1 is a circuit diagram illustrating main portions of a gate driving circuit according to a first embodiment of the invention. The gate driving circuit 10 includes an inverter circuit 11 having same-type NOEMI circuits 14 and 15. The same-type NOEMI circuits 14 and 15 are NOEMI circuits each of which has a NOEM (a p-channel MOSFET QP2 or an n-channel MOSFET QN2) connected in series with a MOSFET (a p-channel MOSFET QP1 or an n-channel MOSFET QN1) that is a main element of the inverter circuit 11 and having the same conductivity type as the MOSFET.

The gate driving circuit 10 includes the inverter circuit 11, and includes a high potential side gate charging circuit 12 (turn-on circuit) and a low potential side gate discharging circuit 13 (turn-off circuit).

The gate charging circuit 12 includes the p-channel MOSFETs QP1 and QP2. The p-channel MOSFET QP2 is the first same-type NOEMI circuit 14 for gate discharging which is always in an ON state.

The gate discharging circuit 13 includes the n-channel MOSFETs QN1 and QN2. The n-channel MOSFET QN2 is a second same-type NOEMI circuit 15 for gate charging which is always in an ON state.

Gates of the p-channel MOSFET QP1 and the n-channel MOSFET QN1 are connected to each other, and the connection point "a" is connected to an input terminal Vin. A source of the p-channel MOSFET QP1 is connected to a high potential side terminal Vcc of a power supply, and a source of the n-channel MOSFET QN1 is connected to a low potential side terminal GND of the power supply. Drains of the p-channel MOSFET QP2 and the n-channel MOSFET QN2 are connected to each other, and the connection point "b" is connected to an output terminal Vout. A gate of the p-channel MOSFET QP2 constituting the first same-type NOEMI circuit 14 is connected to the low potential side terminal GND, and a gate of the n-channel MOSFET QN2 constituting the second same-type NOEMI circuit 15 is connected to the high potential side terminal Vcc.

In FIG. 1, a reference symbol "Vds1" represents a drain-source voltage of the n-channel MOSFET QN1, and a reference symbol "Vds2" represents a drain-source voltage of the n-channel MOSFET QN2. A reference symbol "Vd1" represents a voltage between a connection point of the re-channel MOSFET QN1 and the n-channel MOSFET QN2 and the low potential side terminal GND, and the voltage Vd1 is equal to the drain-source voltage Vds1. A reference symbol "Vd2" is a voltage between the connection point "b" of the p-channel MOSFET QP2 and the n-channel MOSFET QN2 and the low potential side terminal GND, and the voltage Vd2 is equal to the sum of the drain-source voltage Vds1 and the drain-source voltage Vds2.

Figure 2:
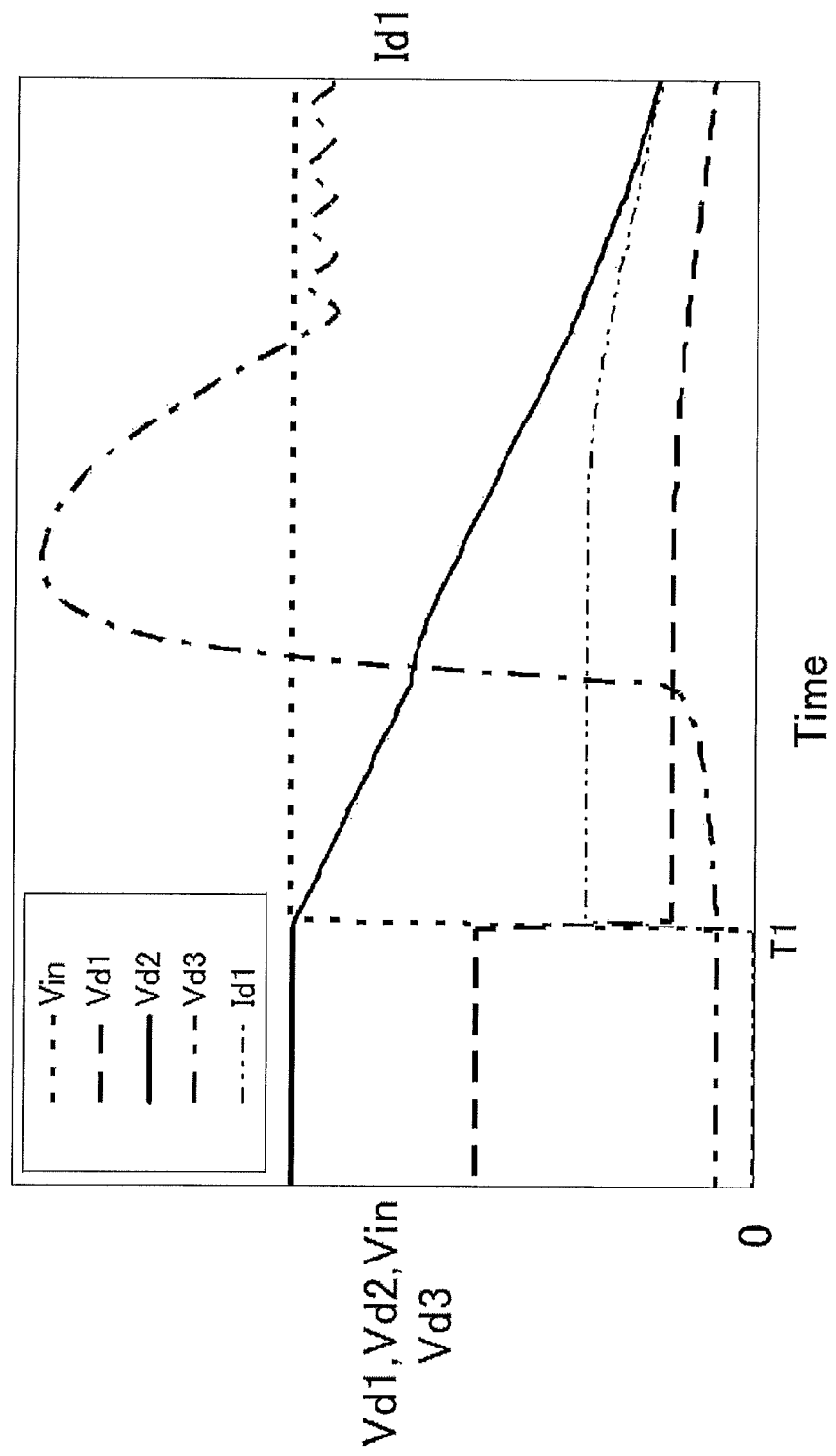
FIG. 2 is a diagram illustrating the waveforms of a drain voltage Vd1 of an n-channel MOSFET QN1, a drain voltage Vd2 of an n-channel MOSFET QN2, a drain voltage Vd3 of a power MOSFET QN4, a current Id1 of the n-channel MOSFET QN1, a voltage of an input terminal Vin, and a voltage of an output terminal Vout, when the n-channel MOSFET QN1 is in an ON state.

FIG. 2 is a diagram illustrating the waveforms of the voltage Vd1 (=Vds1), the voltage Vd2 (=Vds1+Vds2), a voltage Vd3 (=Vds4), a current Id1 of the n-channel MOSFET QN1, and a voltage of an input terminal Vin, when the n-channel MOSFET QN1 is in an ON state. At time T1, an input signal to the input terminal Vin is switched from a low potential to a high potential. The voltages Vd1, Vd2, and Vd3 are voltages relative to the potential of the low potential side terminal GND.

Figure 3:
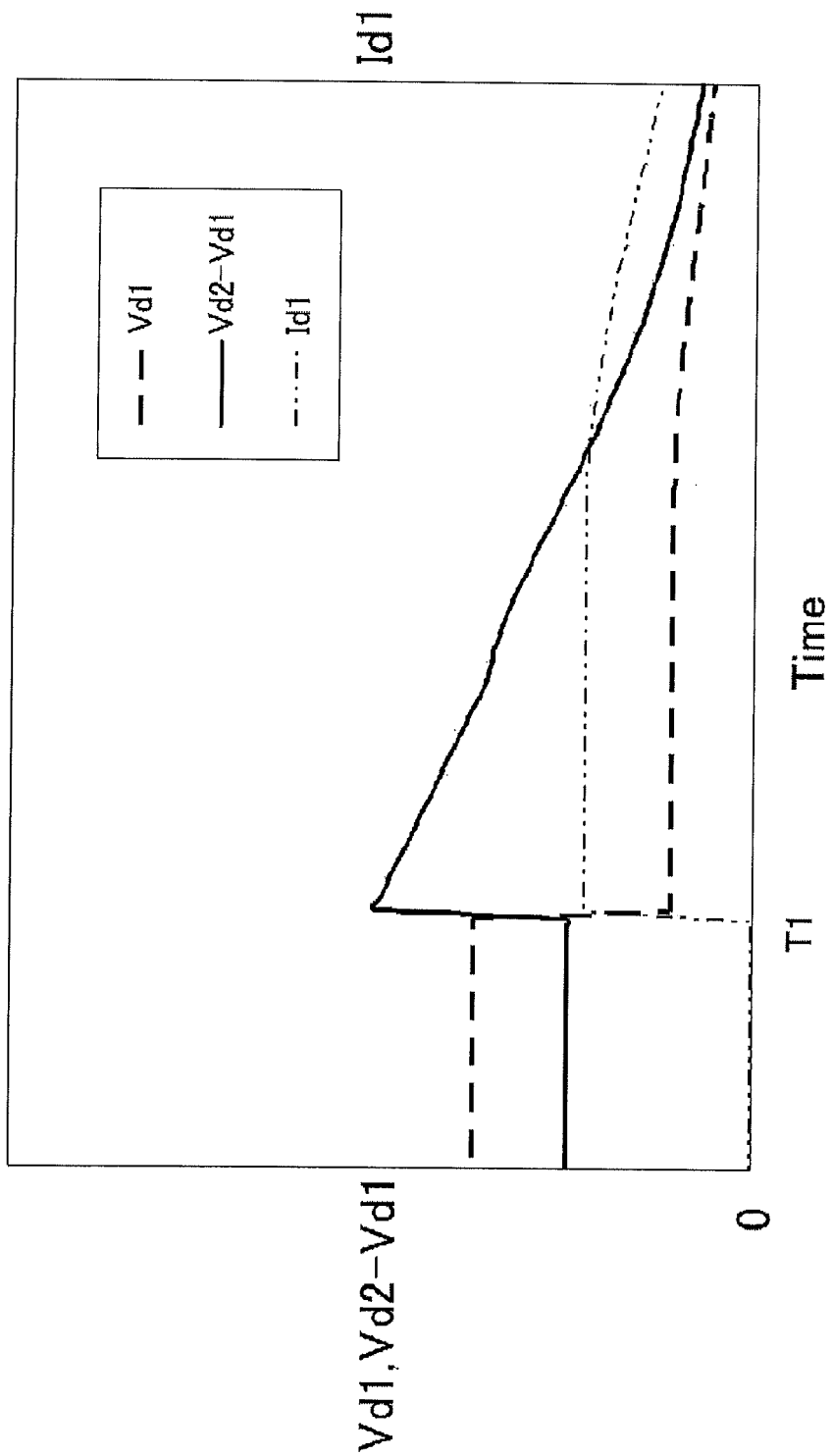
FIG. 3 is a diagram illustrating the waveforms of a drain-source voltage Vds2 (=Vd2−Vd1) of the n-channel MOSFET QN2, and the current Id1 of the n-channel MOSFET QN1.

FIG. 3 is a diagram illustrating the waveforms of a voltage (=Vds2) obtained by subtracting the voltage Vd1 from the voltage Vd2, and the current Id1 of the n-channel MOSFET QN1. Even in this case, at the time T1, the input signal to the input terminal Vin is switched from the low potential to the high potential.

Figure 4:
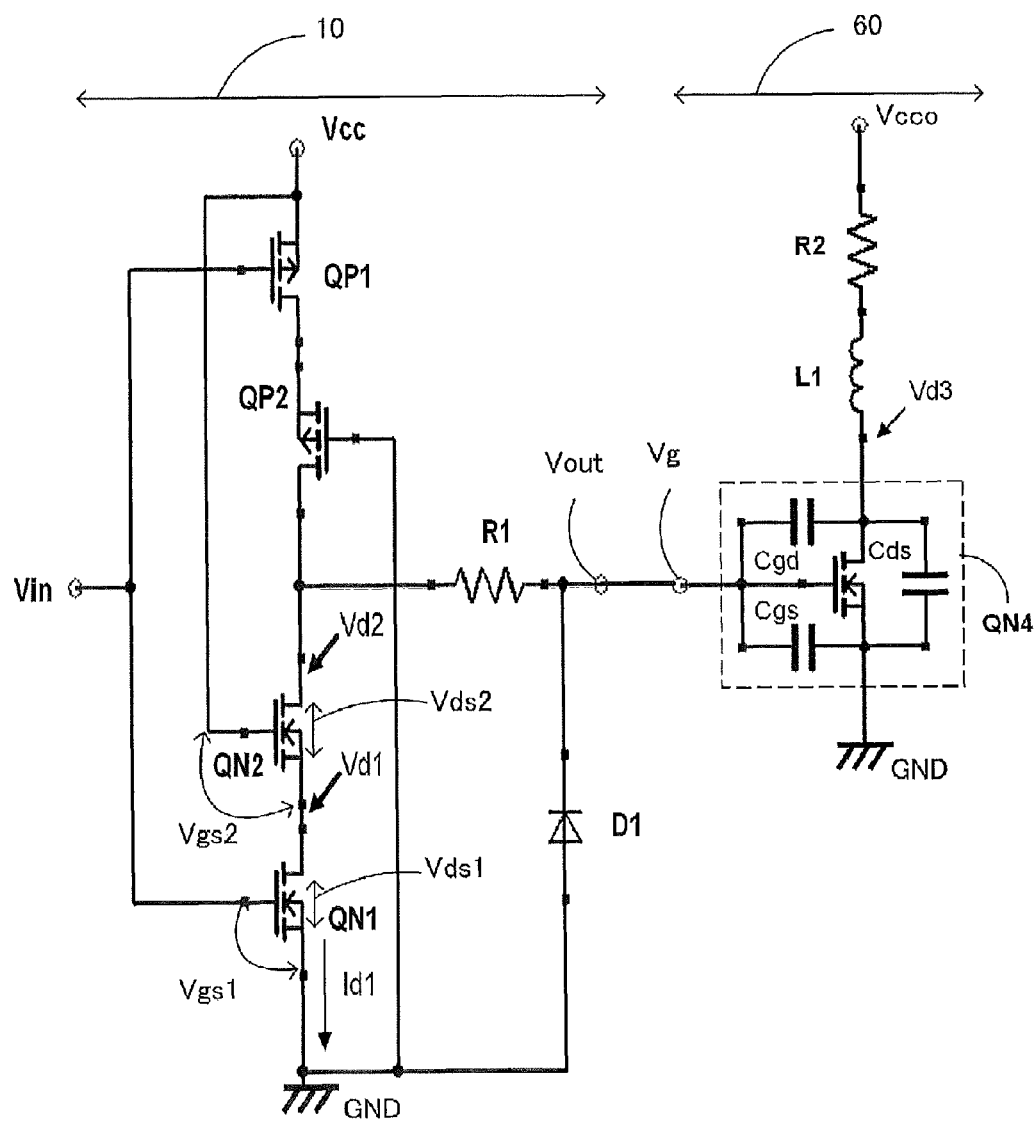
FIG. 4 is a circuit diagram when the output terminal Vout of FIG. 1 is connected to the gate terminal Vg of the power MOSFET QN4 of FIG. 9.
Figure 9:
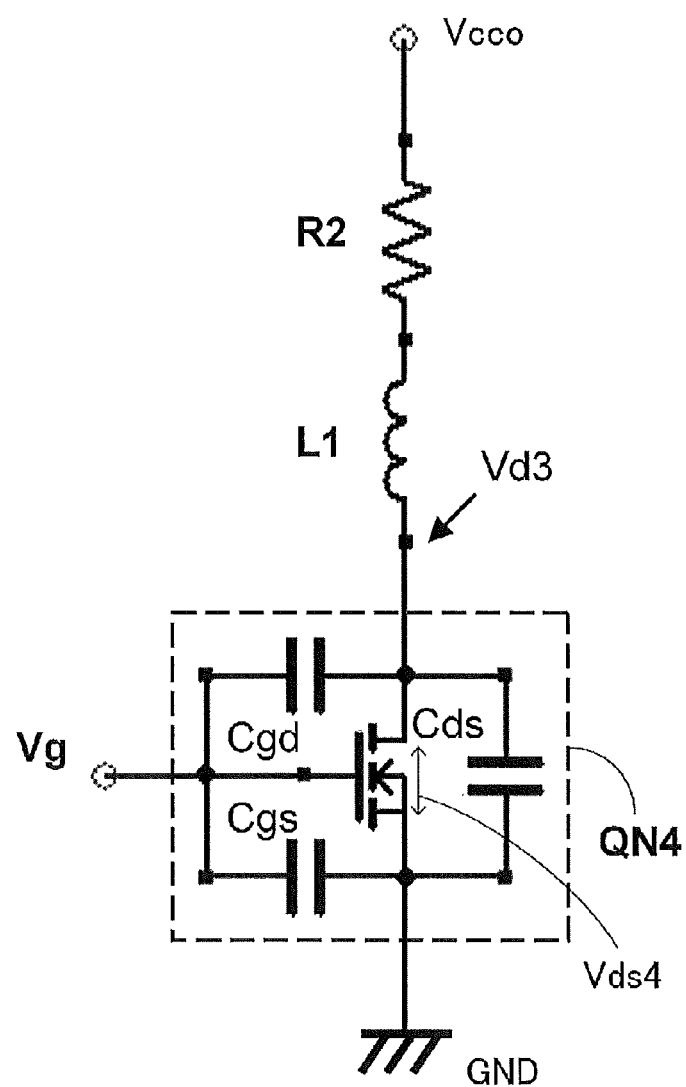
FIG. 9 is a diagram of a main circuit using a power MOSFET as a power MOS.
Figure 10:
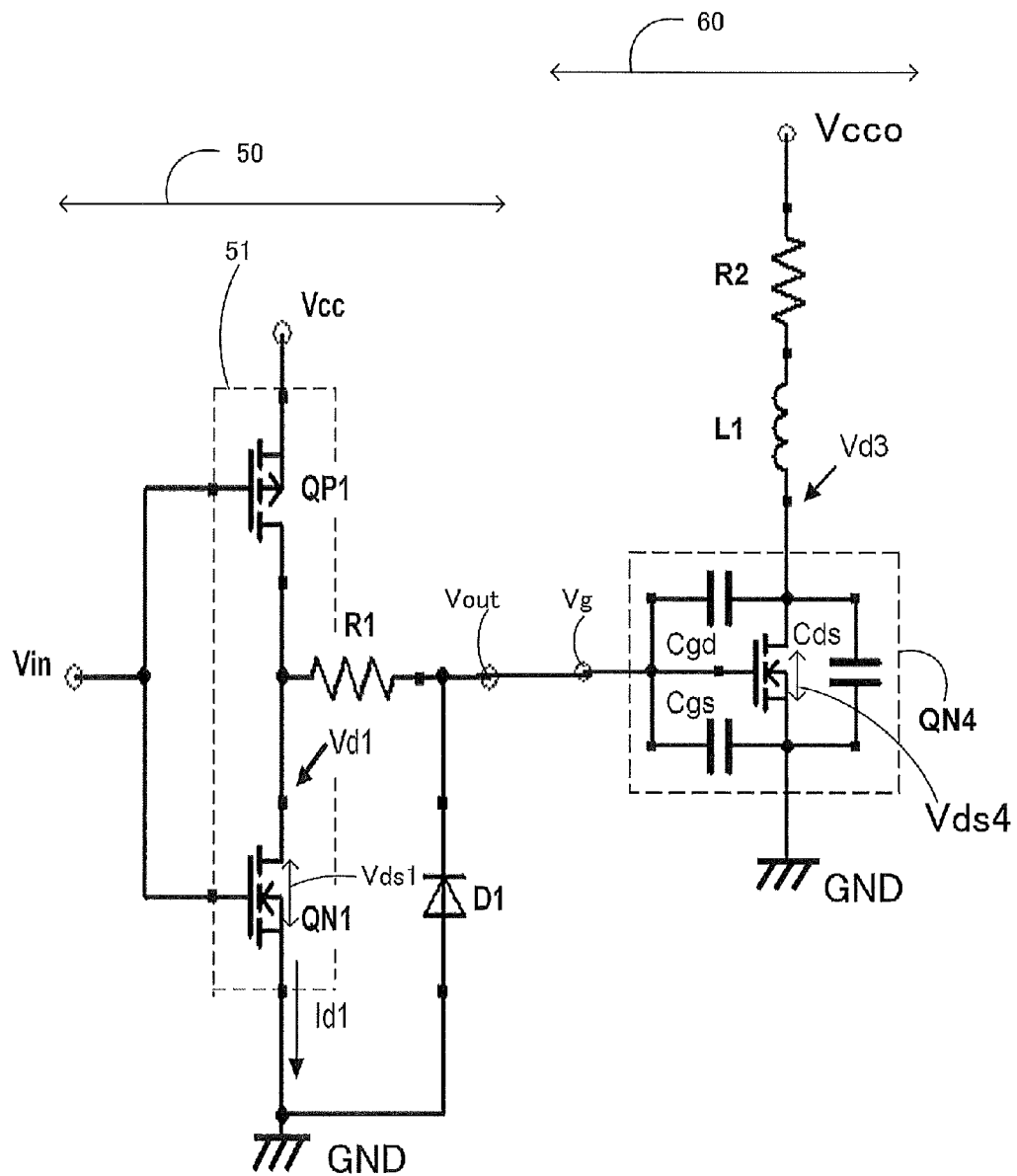
FIG. 10 is a circuit diagram used in a simulation of a case where the gate terminal Vg of FIG. 9 is connected to the output terminal Vout of FIG. 8.
Figure 11:
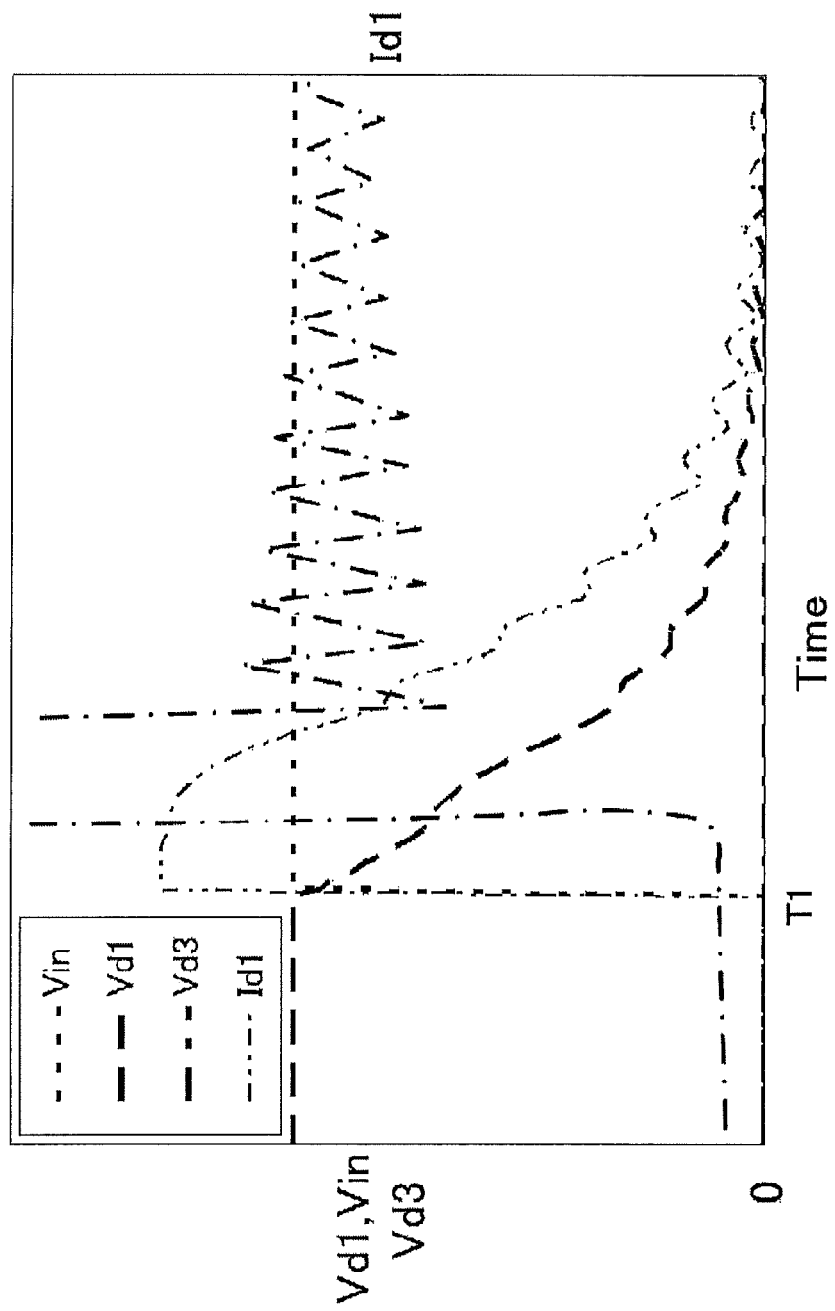
FIG. 11 is a diagram illustrating the waveforms of a drain voltage Vd1 of an n-channel MOSFET QN1, a current Id1 of an n-channel MOSFET QN1, a voltage of an input terminal Vin, and a drain voltage Vd3 of a power MOSFET QN4, when the n-channel MOSFET QN1 is in an ON state.
Figure 12:
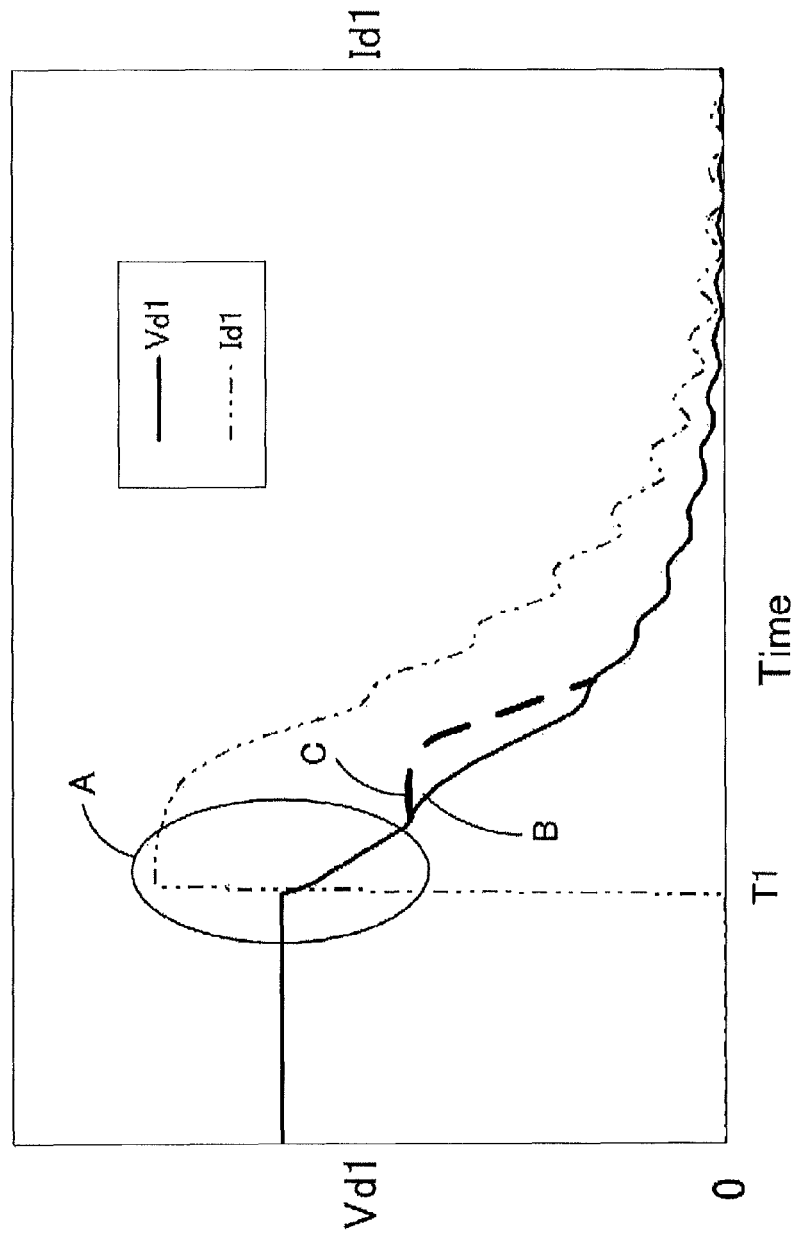
FIG. 12 is a diagram illustrating the waveform of a drain-source voltage Vds1 (=Vd1) of the n-channel MOSFET QN1 and the drain current Id1 of the n-channel MOSFET QN1, when the n-channel MOSFET QN1 is in an ON state.

FIG. 4 is a circuit diagram illustrating a state in which the output terminal Vout of FIG. 1 is connected to the gate terminal Vg of the power MOSFET QN4 of FIG. 9. This circuit was used to simulate the waveform of each portion shown in FIGS. 2 and 3. The size of each element used for the simulation will be described. The channel width W and channel length T of each of the n-channel MOSFET QN1, the n-channel MOSFET QN2, the p-channel MOSFET QP1, and the p-channel MOSFET QP2 were set to, for example, 1000 μm and 1 μm, respectively. Further, for example, a threshold voltage Vth for the n-channel MOSFET QN1 and the n-channel MOSFET QN2 was set to 2 V, and a threshold voltage Vth for the p-channel MOSFET QP1 and the p-channel MOSFET QP2 was set to 1 V.

As shown in FIG. 3, when the n-channel MOSFET QN1 is turned on (at time T1), the drain-source voltage Vds1 (=Vd1) of the n-channel MOSFET QN1 changes to a small value, so that the amount of hot-carriers in the n-channel MOSFET QN1 is suppressed. Since the amount of hot-carriers decreases, the element characteristic deterioration of the n-channel MOSFET QN1 is suppressed.

Further, since a gate-source voltage Vgs2 (=Vcc−Vd1) of the n-channel MOSFET QN2 of FIG. 4 is lower than a gate-source voltage Vgs1 (=Vin=Vcc) of the n-channel MOSFET QN1, the impedance of the n-channel MOSFET QN2 becomes larger than the impedance of the n-channel MOSFET QN1. Therefore, the drain-source voltage Vds2 (=Vd2−Vd1) of the n-channel MOSFET QN2 is increased to be higher than the drain-source voltage Vds1 (=Vd1) of the n-channel MOSFET QN1. During a period in which an increase in the drain-source voltage Vds2 is small, the generation of hot-carriers in the n-channel MOSFET QN2 is suppressed enough, so that the element characteristic deterioration of the n-channel MOSFET QN2 is prevented. As a result, it is possible to manufacture a highly-reliable gate driving circuit 10.

However, if the drain-source voltage Vds2 of the re-channel MOSFET QN2 increases too much, hot-carriers are generated in the n-channel MOSFET QN2 and thus cause element characteristic deterioration of the n-channel MOSFET QN2, which degrades the reliability of the gate driving circuit 10. A measure for preventing this will be described in the next embodiment.

[Second Embodiment]

Figure 5:
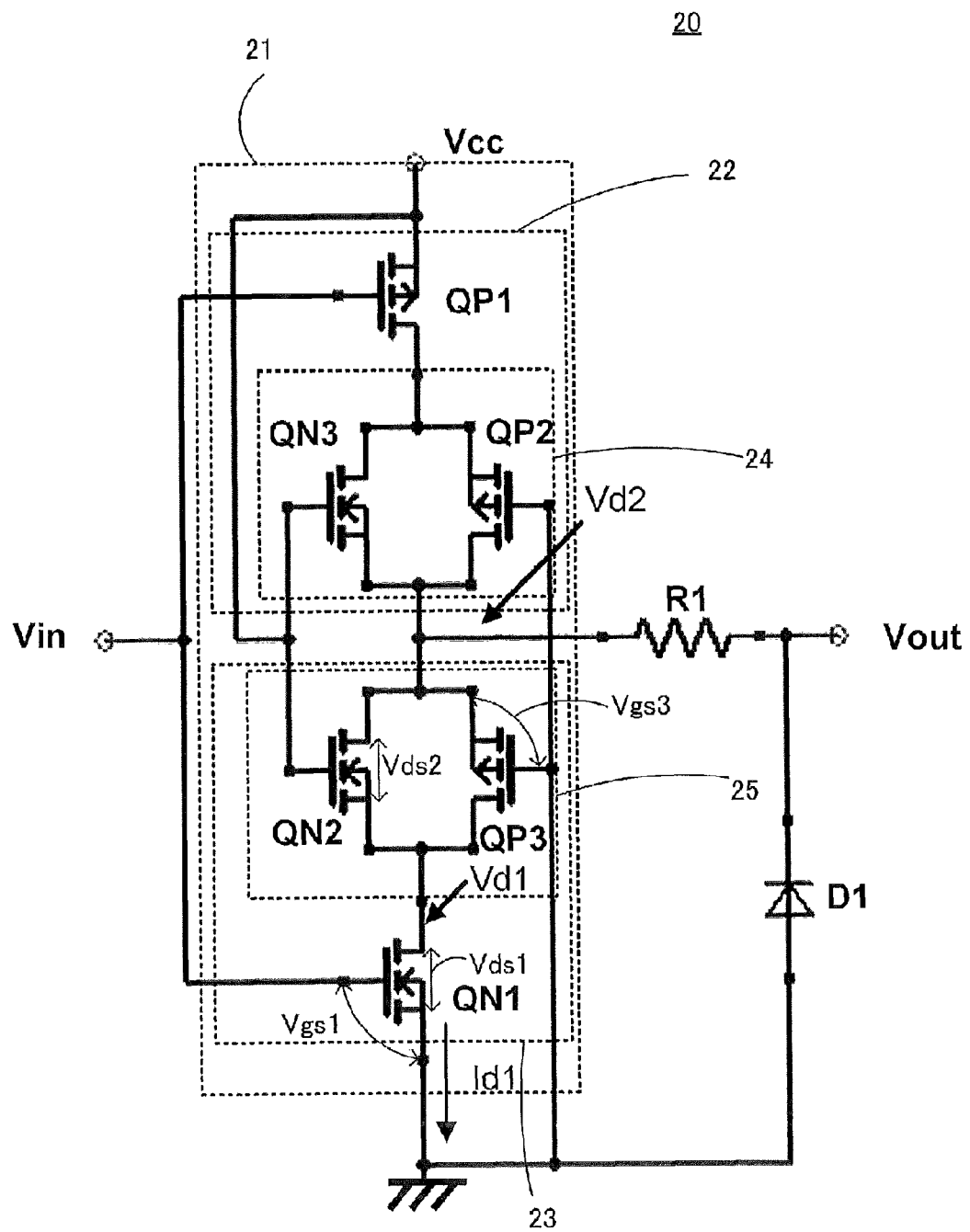
FIG. 5 is a circuit diagram illustrating main portions of a gate driving circuit according to a second embodiment of the invention.

FIG. 5 is a circuit diagram illustrating the main portions of a gate driving circuit according to a second embodiment of the invention. The gate driving circuit 20 includes an inverter circuit 21 having hybrid NOEMI circuits 24 and 25. The hybrid NOEMI circuits 24 and 25 mean NOEMI circuits each of which is obtained by connecting a NOEM (an n-channel MOSFET QN2 or an n-channel MOSFET QN3), having a conductivity type different from that of a MOSFET (a p-channel MOSFET QP1 or an n-channel MOSFET QN1) which is a main element of the inverter circuit 21, in series with the MOSFET, and connecting the NOEM in parallel to a p-channel MOSFET (a p-channel MOSFET QP3 or a p-channel MOSFET QP2).

The gate driving circuit 20 includes the inverter circuit 21, and includes a high potential side gate charging circuit 22 (turn-on circuit) and a low potential side gate discharging circuit 23 (turn-off circuit).

The gate charging circuit 22 includes the p-channel MOSFETs QP1 and QP2, and the n-channel MOSFET QN3. The n-channel MOSFET QN3 and the p-channel MOSFET QP2 constitute the first hybrid NOEMI circuit 24 for gate charging which is always in an ON state.

The gate discharging circuit 23 includes the n-channel MOSFETs QN1 and QN2, and the p-channel MOSFET QP3. The re-channel MOSFET QN2 and the p-channel MOSFET QP3 constitute the second hybrid NOEMI circuit 25 for gate discharging which is always in an ON state.

Further, a hybrid NOEMI circuit includes the first hybrid NOEMI circuit 24 and the second hybrid NOEMI circuit 25.

Furthermore, the p-channel MOSFET QP1 of the gate charging circuit 22 and the n-channel MOSFET QN1 of the gate discharging circuit 23 are alternately turned on or off according to the potential of the input terminal Vin.

Moreover, the total occupied area of the n-channel MOSFET QN3 and the p-channel MOSFET QP2 of FIG. 5 is equal to that of the p-channel MOSFET QP2 of FIG. 1, and the occupied area of the n-channel MOSFET QN2 and the p-channel MOSFET QP3 of FIG. 5 is equal to that of the n-channel MOSFET QN2 of FIG. 1.

In other words, the areas of the first hybrid NOEMI circuit 24 or the second hybrid NOEMI circuit 25 of FIG. 5 is the same as the area of the p-channel MOSFET QP2 of the first same-type NOEMI circuit 14 or the area of the n-channel MOSFET QN2 of the second same-type NOEMI circuits 15 of FIG. 1.

An operation of the gate driving circuit 20 of FIG. 5 will be described below.

While a low-potential signal is input to the input terminal Vin, the p-channel MOSFET QP1 is in an ON state, and the n-channel MOSFET QN1 is in an OFF state. At this time, the output terminal Vout has a high potential and a charging current flows in the p-channel MOSFET QP1, the n-channel MOSFET QN3, and the p-channel MOSFET QP2, so as to charge the gate capacitance Cg (=Cgs+Cgd) of the power MOSFET QN4 connected to the output terminal Vout. If doing so, the power MOSFET QN4 changes to the ON state.

If the signal input to the input terminal Vin is switched from the low potential to the high potential, the p-channel MOSFET QP1 changes to the OFF state, and the re-channel MOS- FET QN1 changes to the ON state. Then, the potential of the output terminal Vout is switched to a low potential, and a discharging current flows in the n-channel MOSFET QN2, the p-channel MOSFET QP3, and the n-channel MOSFET QN1, so as to discharge the charge of the gate capacitance Cg (=Cgs+Cgd) of the power MOSFET QN4 connected to the output terminal Vout.

As described above, in the second same-type NOEMI circuit 15 of FIG. 1, when the input signal is switched from the low potential to the high potential, the gate-source voltage Vgs2 of the n-channel MOSFET QN2 becomes lower than the gate-source voltage Vgs1 of the n-channel MOSFET QN1, and thus the drain-source voltage Vds2 of the n-channel MOSFET QN2, which is an NOEM, becomes higher, so hot-carriers are easily generated. At this time, the drain-source voltage Vds2 of the n-channel MOSFET QN2 becomes higher than the drain-source voltage Vds1 of the re-channel MOSFET QN1.

In contrast, in the second hybrid NOEMI circuit 25 of FIG. 5, when the input signal to the input terminal Vin is switched from the low potential to the high potential, a gate-source voltage Vgs3 of the p-channel MOSFET QP3 is the voltage of the high potential side terminal Vcc, and the gate-source voltage Vgs1 of the n-channel MOSFET QN1 changes to the high potential (=Vcc), so that both voltages become equal to each other. Therefore, the drain-source voltages Vds1 and Vds2 applied to the n-channel MOSFET QN1 and the n-channel MOSFET QN2 which is the NOEM are equalized. As a result, the drain-source voltage Vds2 (which is the same as a source-drain voltage of the p-channel MOSFET QP3) of the n-channel MOSFET QN2 of FIG. 5 becomes lower than the drain-source voltage Vds2 (which is higher than the drain-source voltage Vds1 of the n-channel MOSFET QN1 of FIG. 1) of the n-channel MOSFET QN2 of FIG. 1. Therefore, it is possible to suppress the amount of hot-carriers generated in the n-channel MOSFET QN2 and the p-channel MOSFET QP3 of FIG. 5. As the current drive capability of the p-channel MOSFET QP3 increases, the drain-source voltage Vds2 decreases, so that effect becomes remarkable.

Further, the n-channel MOSFET QN2 functions to compensate for the decrease in the current drive capability of the p-channel MOSFET QP3 when the potential of the output terminal Vout decreases. In a case where the re-channel MOSFET QN2 does not exist, the gate-source voltage Vgs3 of the p-channel MOSFET QP3 becomes lower, and if the gate-source voltage Vgs3 reaches a level equal to or lower than the gate threshold voltage Vth, the potential of the output terminal Vout is lowered to the potential of the low potential side terminal GND. As the potential of the output terminal Vout decreases, the gate-source voltage Vgs2 of the n-channel MOSFET QN2 increases, so that the current drive capability of the n-channel MOSFET QN2 increases to compensate for the p-channel MOSFET QP3. In this way, it is possible to reduce the potential of the output terminal Vout to the potential of the low potential side terminal GND.

Figure 6:
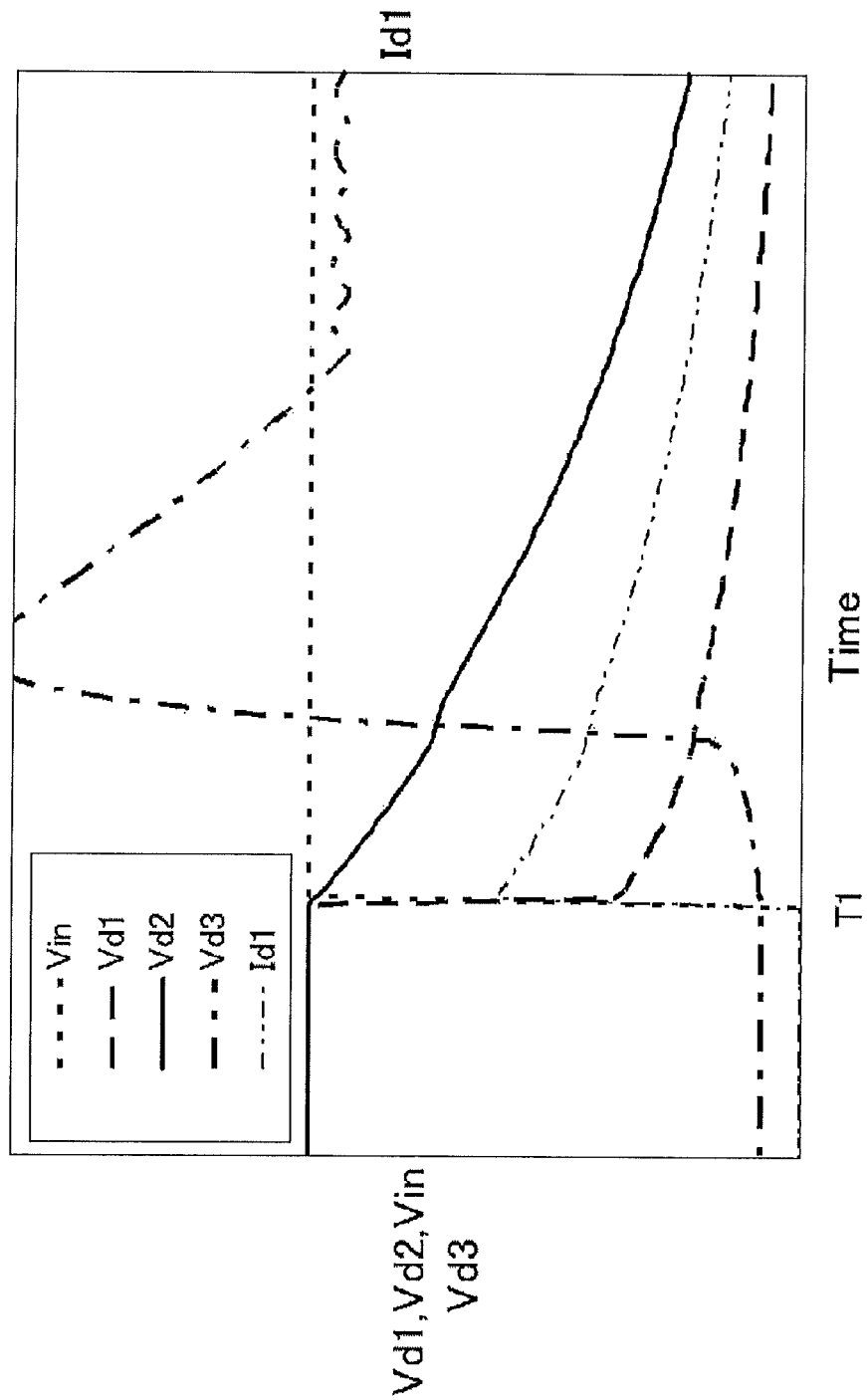
FIG. 6 is a diagram illustrating the waveforms of the voltage of the input terminal Vin, the drain voltage Vd1 of the n-channel MOSFET QN1, the drain voltage Vd2 of the n-channel MOSFET QN2, and the drain voltage Vd3 of the power MOSFET QN4.

FIG. 6 is a diagram illustrating the waveforms of the voltage of the input terminal Vin, the voltage Vd1 (=Vds1), the voltage Vd2 (Vds1+Vds2), the voltage Vd3 (Vds4), and the current Id1 of FIG. 5.

Figure 7:
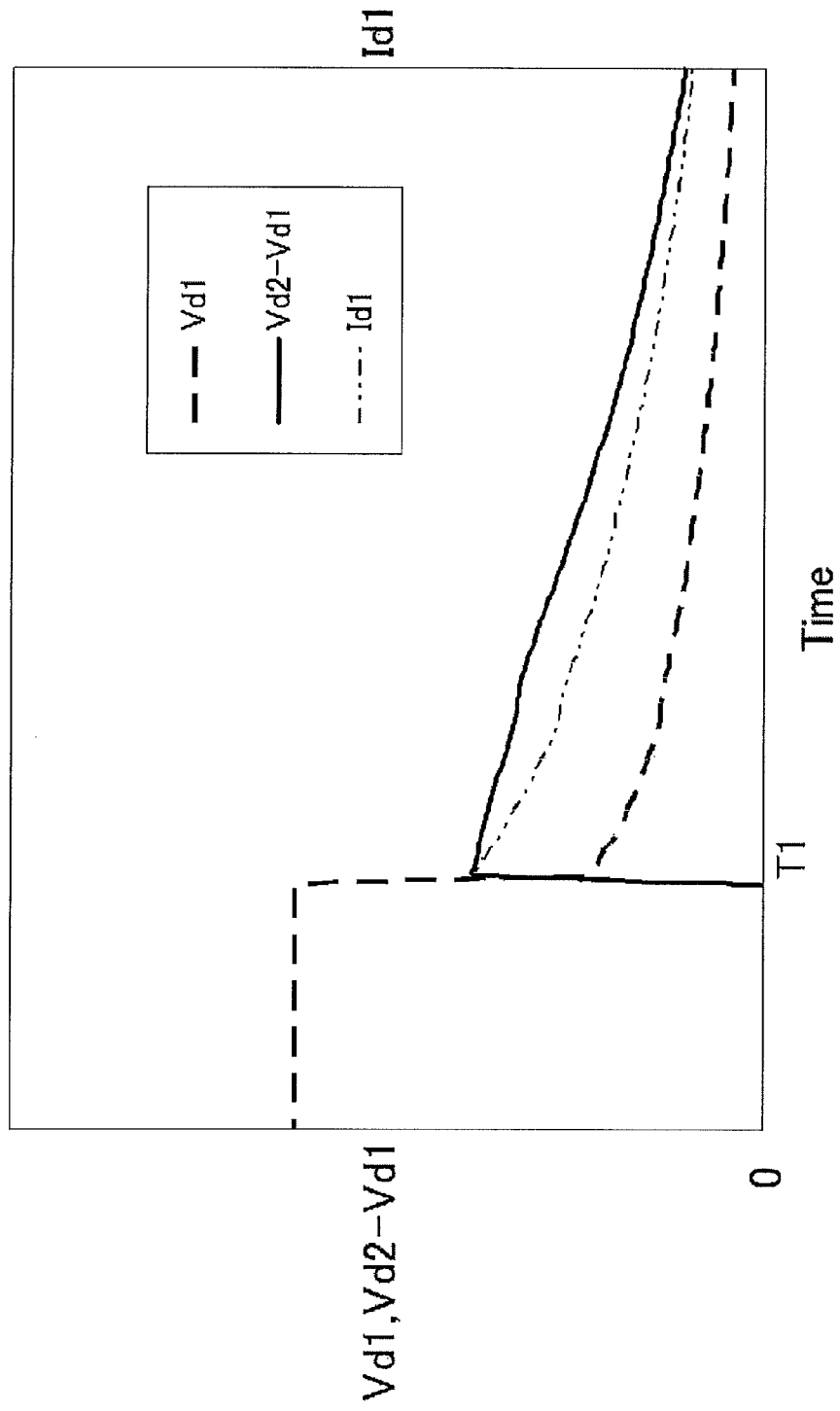
FIG. 7 is a diagram illustrating the waveforms of the drain-source voltage Vds2 (=Vd2−Vd1) of the n-channel MOSFET QN2, and the current Id1 of the n-channel MOSFET QN1.
Figure 8:
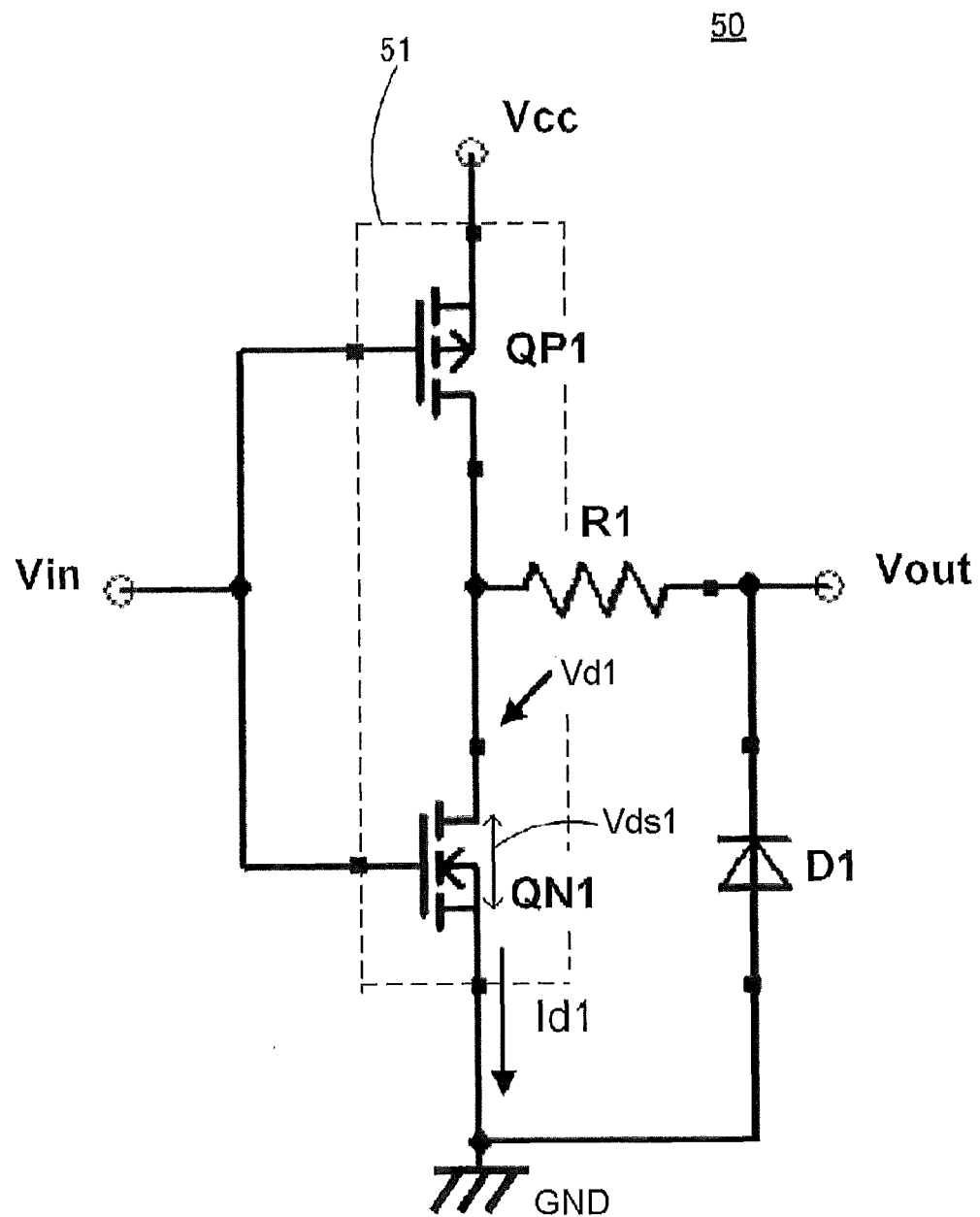
FIG. 8 is a circuit diagram of a gate driving circuit for driving a power MOS according to the related art.

FIG. 7 is a diagram illustrating the waveforms of the voltage Vd1 (Vds1), a voltage Vds2 (Vd2−Vd1), and the current Id1 of FIG. 5.

FIGS. 6 and 7 show the simulation waveforms of the voltages and the currents when the circuit of FIG. 9 is driven by the circuit of FIG. 5.

As for the size of each element, when a reference symbol "W" represents a channel width, and a reference symbol "T" represents a channel length, for example, the re-channel MOSFET QN1 and the p-channel MOSFET QP1 have the channel width W of 1000 μm and the channel length T of 1 μm, and the n-channel MOSFET QN2, the n-channel MOSFET QN3, the p-channel MOSFET QP2, and the p-channel MOSFET QP3 have a channel width W of 500 μm and the channel length T of 1 μm. The total area of all the hybrid NOEMI circuits (the total area of the n-channel MOSFET QN2, the p-channel MOSFET QP3, the n-channel MOSFET QN3, and the p-channel MOSFET QP2) was set to be equal to the total area of the same-type NOEMI circuits 14 and 15 (the total area of the n-channel MOSFET QN2 and the p-channel MOSFET QP2) of FIG. 1.

The n-channel MOSFET QN1, the n-channel MOSFET QN2, and the n-channel MOSFET QN3 have the threshold voltage of 2 V, and the p-channel MOSFET QP1, the p-channel MOSFET QP2, and the p-channel MOSFET QP3 have the threshold voltage of 1 V. Further, the input signal to the input terminal Vin is the same as that in the simulation of FIG. 2, and was set so as to have a low potential until the time T1 and the high potential after the time T1.

In the simulation waveforms of FIG. 6, at the time T1, the n-channel MOSFET QN1 and the n-channel MOSFET QN2 are switched from the OFF state to the ON state, similarly to the simulation waveforms of FIG. 2 and FIG. 6, the voltages Vd1 (=Vds1) and Vd2 (Vds1+Vds2) decrease together.

In FIG. 7, the falling edge of the voltage (Vd2−Vd1) (which is the same as the drain-source voltage Vds2 of the n-channel MOSFET QN2) immediately after the changing to the ON state becomes gentler than the falling edge of the voltage Vd1 (which is the same as the drain-source voltage Vds1 of the n-channel MOSFET QN1). Further, the value of the voltage (Vd2−Vd1) of FIG. 7 becomes smaller than that of the voltage (Vd2−Vd1) of FIG. 3. Furthermore, the gate-source voltage Vgs3 of the p-channel MOSFET QP3 and the gate-source voltage Vgs1 of the n-channel MOSFET QN1 are almost the same as each other (=Vcc), and the voltage of the output terminal Vout is divided into the n-channel MOSFET QN1 and the second hybrid NOEMI circuit 25. Therefore, in the case of FIG. 7, the falling edge of the drain-source voltage Vds1 (=Vd1) of the n-channel MOSFET QN1 becomes larger than in the case of FIG. 3 (flat waveform) after switching.

As a result, as shown in FIG. 7, the drain-source voltage Vds2 (=Vd2−Vd1) becomes larger than the drain-source voltage Vds1 (=Vd1). However, the magnitude of the drain-source voltage Vds2 is smaller than that of the drain-source voltage Vds2 (=Vd2−Vd1) shown in FIG. 3. Therefore, it is possible to make the amounts of hot-carriers generated in the n-channel MOSFET QN2 and the p-channel MOSFET QP3 of the second hybrid NOEMI circuit 25 of FIG. 5 smaller than the amount of hot-carriers generated in the n-channel MOSFET QN2 of the second same-type NOEMI circuit 15 of FIG. 1. As a result, it is possible to prevent element characteristic deterioration of the re-channel MOSFET QN2 and to manufacture a highly-reliable gate driving circuit 20.

Further, although the first embodiment and the second embodiment have been described focusing on the gate discharging circuits 13 and 23, the gate charging circuits 12 and 22 also have the same effects. This will be described next briefly.

In the case of the gate charging circuit 22, if the power MOSFET QN4 is turned on, the voltage Vd3 decreases by the inductance L of the inductor L1. As a result, a voltage applied between the p-channel MOSFET QP1 and the first same-type NOEMI circuit 14 or between the p-channel MOSFET QP1 and the first hybrid NOEMI circuit 22 becomes high. However, since the most of the voltage is applied to the first same-type NOEMI circuit 14, it is presumed that the drain-source voltage Vdsp1 of the p-channel MOSFET QP1 to become small, so that the generation of hot-carriers is suppressed. If the voltage applied to the first same-type NOEMI circuit 14 increases, hot-carriers are generated in the p-channel MOSFET QP2 of the first same-type NOEMI circuit 14.

However, it is possible to decrease the applied voltage by replacing the first same-type NOEMI circuit 14 with the first hybrid NOEMI circuit 22. Therefore, the amount of hot-carriers generated in the p-channel MOSFET QP2 and the n-channel MOSFET QN3 of the first hybrid NOEMI circuit 22 may be smaller than that in the p-channel MOSFET QP2 of the first same-type NOEMI circuit 14.

Although the cases of using the power MOSFET as the power MOS have been described in the first embodiment and the second embodiment, the power MOS may be an IGBT.

Finally, it is noted that while the present invention has been particularly shown and described with reference to preferred embodiments thereof, it will be understood by those skilled in the art that the foregoing and other changes in form and details can be made therein without departing from the spirit and scope of the present invention.

What is claimed is:

1. A gate driving circuit for driving an insulated gate switching element, comprising:
    a gate charging circuit configured to charge gate capacitance of the insulated gate switching element, the gate charging circuit including
        a first p-channel metal oxide semiconductor field effect transistor (MOSFET), and
        a first hybrid normally-on enhancement MOSFET insertion (NOEMI) circuit connected in series with a drain of the first p-channel MOSFET; and
    a gate discharging circuit, connected in series with the gate charging circuit, configured to discharge a charge of the gate capacitance, the gate discharging circuit including
        a first n-channel MOSFET, and
        a second hybrid NOEMI circuit connected in series with a drain of the first n-channel MOSFET, wherein
    the first hybrid NOEMI circuit includes a second p-channel MOSFET and a third n-channel MOSFET connected in parallel to each other,
    the second hybrid NOEMI circuit includes a second n-channel MOSFET and a third p-channel MOSFET connected in parallel to each other,
    each of a gate of the second n-channel MOSFET and a gate of the third n-channel MOSFET is connected to a first terminal,
    each of a gate of the second p-channel MOSFET and a gate of the third p-channel MOSFET is connected to a second terminal,
    a source of the second p-channel MOSFET is connected to the drain of the first p-channel MOSFET,
    a source of the third n-channel MOSFET is connected to the drain of the first n-channel MOSFET,
    a source of the first p-channel MOSFET is connected to the first terminal,
    a source of the first n-channel MOSFET is connected to the second terminal,
    a gate of the first p-channel MOSFET and a gate of the first n-channel MOSFET are connected to an input terminal to which an input signal is input, and
    a connection point of a drain of the second p-channel MOSFET and a drain of the third n-channel MOSFET is connected to an output terminal through a resistor, the output terminal being connected to a gate of the insulated gate switching element.

2. The gate driving circuit according to claim 1,
    wherein a channel width of each of the second p-channel MOSFET and the third n-channel MOSFET that constitute the first hybrid NOEMI circuit is half of a channel width of the first p-channel MOSFET, and
    wherein a channel width of each of the second n-channel MOSFET and the third p-channel MOSFET that constitute the second hybrid NOEMI circuit is half of a channel width of the first n-channel MOSFET.

3. The gate driving circuit according to claim 1, wherein the gate charging circuit and the gate discharging circuit constitute an inverter circuit.

4. The gate driving circuit according to claim 1, wherein the insulated gate switching element is an insulated gate bipolar transistor (IGBT) or a power MOSFET.

5. The gate driving circuit according to claim 1, wherein the first terminal is a high potential power supply side terminal, and the second terminal is a low potential power supply side terminal.

* * * * *